United States Patent
Lee et al.

(10) Patent No.: US 9,269,790 B2
(45) Date of Patent: Feb. 23, 2016

(54) HIGH-ELECTRON-MOBILITY TRANSISTOR

(71) Applicant: Samsung Electronics Co., Ltd., Suwon-si (KR)

(72) Inventors: Jae-hoon Lee, Suwon-si (KR); Chan-ho Park, Seongnam-si (KR); Nam-young Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 53 days.

(21) Appl. No.: 14/097,709

(22) Filed: Dec. 5, 2013

(65) Prior Publication Data

US 2014/0252368 A1 Sep. 11, 2014

(30) Foreign Application Priority Data

Mar. 8, 2013 (KR) .................. 10-2013-0025251

(51) Int. Cl.
*H01L 29/66* (2006.01)
*H01L 29/778* (2006.01)
*H01L 29/20* (2006.01)

(52) U.S. Cl.
CPC ...... *H01L 29/66462* (2013.01); *H01L 29/7787* (2013.01); *H01L 29/2003* (2013.01)

(58) Field of Classification Search
CPC .............. H01L 29/66462; H01L 29/7787; H01L 29/2003
USPC ............................................ 257/194
See application file for complete search history.

(56) References Cited

U.S. PATENT DOCUMENTS

| | | | |
|---|---|---|---|
| 6,233,438 B1 * | 5/2001 | Wynn | 455/126 |
| 7,038,253 B2 | 5/2006 | Yoshida et al. | |
| 7,576,373 B1 | 8/2009 | Hikita et al. | |
| 7,728,356 B2 | 6/2010 | Suh et al. | |
| 7,816,707 B2 | 10/2010 | Hikita et al. | |
| 7,898,002 B2 | 3/2011 | Hikita et al. | |
| 7,915,643 B2 | 3/2011 | Suh et al. | |
| 8,084,785 B2 | 12/2011 | Briere | |
| 8,129,748 B2 | 3/2012 | Uemoto et al. | |
| 2004/0132291 A1 * | 7/2004 | Lee et al. | 438/689 |
| 2010/0320505 A1 | 12/2010 | Okamoto et al. | |
| 2011/0193096 A1 | 8/2011 | Imada | |
| 2012/0086049 A1 | 4/2012 | Hwang et al. | |
| 2012/0098598 A1 * | 4/2012 | Uno et al. | 330/277 |
| 2012/0112202 A1 | 5/2012 | Hwang et al. | |
| 2012/0193688 A1 | 8/2012 | Lidow et al. | |
| 2013/0082276 A1 * | 4/2013 | Park et al. | 257/76 |
| 2013/0112986 A1 * | 5/2013 | Hsiung et al. | 257/76 |
| 2014/0097470 A1 * | 4/2014 | Kim et al. | 257/194 |
| 2014/0253241 A1 * | 9/2014 | Lee et al. | 330/277 |

FOREIGN PATENT DOCUMENTS

| | | |
|---|---|---|
| JP | 2010263011 | 11/2010 |
| JP | 2012004503 | 1/2012 |
| KR | 20100034921 | 4/2010 |

* cited by examiner

*Primary Examiner* — Ajay K Arora
(74) *Attorney, Agent, or Firm* — Onello & Mello, LLP (57) ABSTRACT

A high-electron-mobility transistor (HEMT) device includes a plurality of semiconductor layers formed on a substrate, wherein a two-dimensional electron gas (2DEG) layer is formed in the semiconductor layers; an etch-stop layer formed on the plurality of semiconductor layers; a p-type semiconductor layer pattern formed on the etch-stop layer; and a gate electrode formed on the p-type semiconductor layer pattern.

12 Claims, 7 Drawing Sheets

HIGH-ELECTRON-MOBILITY TRANSISTOR

CROSS-REFERENCE TO RELATED APPLICATIONS

This application claims priority under 35 U.S.C. §119 from Korean Patent Application No. 10-2013-0025251, filed on Mar. 8, 2013, in the Korean Intellectual Property Office, the disclosure of which is incorporated herein in its entirety by reference.

BACKGROUND

The present inventive concepts relate to a high-electron-mobility transistor (HEMT) device, and more particularly, to a HEMT device that has a "normally off" characteristic.

In order to use as a transistor for a power device that obtains a high breakdown voltage and fast response speeds, a study on a high-electron-mobility transistor (HEMT) has been actively conducted. An HEMT device includes semiconductor layers with different electrical polarization characteristics, and a semiconductor layer with relatively great polarizability in the HEMT device may cause another semiconductor layer bonded heterogeneously thereto to have two-dimensional electron gas (2DEG), i.e., a gas of electrons free to move in two dimensions but tightly confined in the third dimension. The 2DEG may serve as a channel between a drain electrode and a source electrode, and currents flowing in the channel may be controlled by a bias voltage applied to a gate electrode. A conventional HEMT device, e.g., an HEMT device using a heterogeneous junction by a group III-nitride semiconductor, has a "normally on" characteristic and has high power consumption due to such a normally on characteristic.

SUMMARY

The inventive concepts provide a high-electron-mobility transistor with a stable normally off characteristic.

According to an aspect of the inventive concepts, there is provided a high-electron-mobility transistor device, including a plurality of semiconductor layers formed on a substrate, wherein a two-dimensional electron gas (2DEG) layer is formed in the semiconductor layers; etch-stop layers formed on the plurality of semiconductor layers; a p-type semiconductor layer pattern formed on the etch-stop layer; and a gate electrode formed on the p-type semiconductor layer pattern.

The plurality of semiconductor layers may include a first semiconductor layer and a second semiconductor layer that are sequentially formed on the substrate, and the 2DEG region may be formed in a part of the first semiconductor layer adjacent to an interface between the first semiconductor layer and the second semiconductor layer.

The 2DEG region may be omitted from a part of the first semiconductor layer that overlaps with the p-type semiconductor layer pattern.

The second semiconductor layer may include a material having band gap energy higher than that of the first semiconductor layer.

The first semiconductor layer may include gallium nitride, and the second semiconductor layer may include aluminum gallium nitride.

The p-type semiconductor layer pattern may include gallium nitride doped with p-type impurities or aluminum gallium nitride doped with p-type impurities.

The etch-stop layer may be in contact with an entire bottom surface of the p-type semiconductor layer pattern.

The etch-stop layer may include silicon carbon nitride ($SiXCl_{1-x}N$), where $0 \leq x \leq 1$.

The high-electron-mobility transistor device may further include a hole injection layer between the etch-stop layer and the second semiconductor layer.

The high-electron-mobility transistor device may further include an n-type semiconductor layer between the p-type semiconductor layer pattern and the gate electrode.

According to another aspect of the inventive concepts, there is provided a high-electron-mobility transistor device, including a channel layer formed on a substrate; a channel-supplying layer formed on the channel layer; an etch-stop layer formed on the channel-supplying layer; a p-type semiconductor layer pattern formed on a part of the etch-stop layer; and a gate electrode on the p-type semiconductor layer pattern.

The etch-stop layer may be formed on an entire top surface of the channel-supplying layer.

The high-electron-mobility transistor device may further include a source electrode and a drain electrode that pass through the etch-stop layer and the channel-supplying layer and are connected to the channel layer.

The gate electrode may be formed to vertically overlap with the p-type semiconductor layer pattern.

The p-type semiconductor layer pattern may have a shape corresponding to that of the gate electrode.

According to another aspect of the inventive concepts, a radio frequency power amplifier module includes a power amplifier module including at least one high electron mobility transistor (HEMT), as described above; a transceiver coupled with the power amplifier module and configured to receive an input signal and to transmit the input signal to the power amplifier module, wherein the power amplifier module is configured to amplify the input signal received from the transceiver; and an antenna switch module coupled with the power amplifier module and including an antenna structure, wherein the antenna switch module is configured to receive the amplified input signal from the power amplifier module and to transmit the amplified input signal over the air via the antenna structure.

The antenna switch module of the RF power amplifier may also be configured to receive the input signal through the antenna structure and to transmit the input signal to the transceiver.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF THE EMBODIMENTS

Exemplary embodiments of the present inventive concepts will be described in detail with reference to the accompanying drawings. As used herein, the term "and/or" includes any and all combinations of one or more of the associated listed items. Expressions such as "at least one of," when preceding a list of elements, modify the entire list of elements and do not modify the individual elements of the list.

The inventive concepts may, however, be embodied in many different forms and should not be construed as being limited to the embodiments set forth herein; rather, these embodiments are provided so that this disclosure will sufficiently describe and enable the concepts of the invention to those skilled in the art. In the drawings, the thickness or size of each layer is exaggerated for convenience of description and clarity.

Figure 1:
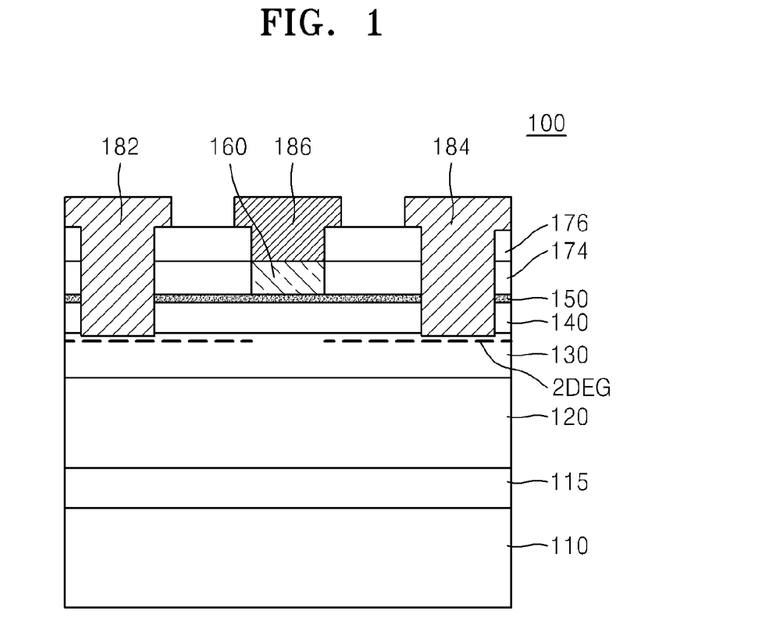
FIG. 1 is a cross-sectional view of a high-electron-mobility transistor (HEMT) device according to an exemplary embodiment.

FIG. 1 is a cross-sectional view of a high-electron-mobility transistor (HEMT) device 100 according to an exemplary embodiment.

Referring to FIG. 1, the HEMT device 100 may include a substrate 110, a buffer layer 115, a high-resistance semiconductor layer 120, a channel layer 130, a channel-supplying layer 140, an etch-stop layer 150, a p-type semiconductor layer pattern 160, a source electrode 182, a drain electrode 184, and a gate electrode 186.

The substrate 110 may be a sapphire substrate, a silicon carbide substrate, a gallium nitride substrate, a silicon substrate, a germanium substrate, an aluminum nitride substrate, etc. For example, a single-crystal silicon carbide substrate with high thermal conductivity may be used as the substrate 110.

The buffer layer 115 may be formed on the substrate 110. The buffer layer 115 may work as a stress alleviating region that alleviates stress generated due to a lattice constant difference between the substrate 110 and the high-resistance semiconductor layer 120 or defects such as misfit dislocations generated due to the lattice constant difference. In exemplary embodiments, the buffer layer 115 may include gallium nitride, aluminum nitride, aluminum gallium nitride, silicon carbon nitride, or combinations thereof.

Although not shown, a superlattice layer (not shown) that has a multi-layer structure of aluminum nitride/gallium nitride/aluminum nitride/gallium nitride may be further formed between the substrate 110 and the buffer layer 115. In addition, a stacked structure which a plurality of aluminum gallium nitride, $Al_xGa_{1-x}N$ layers, with different content forms may be further included. In addition, a plurality of protrusions (not shown) may be further formed between the substrate 110 and the buffer layer 115.

The high-resistance semiconductor layer 120 may be formed on the buffer layer 115. In exemplary embodiments, the high-resistance semiconductor layer 120 may be a semi-insulating layer having high resistance. In this case, when electrons move in the channel layer 130 formed on the high-resistance semiconductor layer 120, leakage of currents through the high-resistance semiconductor layer 120 may be avoided. Electron mobility in the channel layer 130 may be increased, thereby decreasing an on-resistance of the HEMT device 100. In this case, the on-resistance indicates a resistance between the source electrode 182 and the drain electrode 184 when a voltage is applied to the gate electrode 186.

For example, the high-resistance semiconductor layer 120 may include a gallium nitride layer having a sheet resistance of about $10^7$ $\Omega cm^{-2}$ to $10^{11}$ $\Omega cm^{-2}$, but the high-resistance semiconductor layer 120 is not limited thereto. In exemplary embodiments, the high-resistance semiconductor layer 120 may be an undoped gallium nitride layer or a gallium nitride layer doped with dopants, such as magnesium (Mg), zinc (Zn), carbon (C), iron (Fe), etc.

The channel layer 130 may be formed on the high-resistance semiconductor layer 120. The channel layer 130 may include at least one of the following various materials: aluminum nitride, gallium nitride, indium nitride, indium gallium nitride, aluminum gallium nitride, aluminum indium nitride, etc. However, the material of the channel layer 130 is not limited thereto and any material layer in which a two-dimensional electron gas (2DEG) may be formed may be used. The channel layer 130 may be an undoped semiconductor layer, but in some cases, the channel layer 130 may be a semiconductor layer in which a given dopant is doped. For example, the channel layer 130 may be an undoped gallium nitride layer. For example, the thickness of the channel layer 130 may be in a range of about 10 nm to about 100 nm.

The channel-supplying layer 140 may be formed on the channel layer 130. The channel-supplying layer 140 may include a semiconductor material having a band gap energy higher than that of the channel layer 130. In exemplary embodiments, the channel-supplying layer 140 may have a single layered or multi-layered structure that includes one or more materials that are selected from nitrides including at least one of aluminum, gallium, and indium. In exemplary embodiments, the channel-supplying layer 140 may be an undoped aluminum gallium nitride layer. For example, the channel-supplying layer 140 may be an $Al_xGa_{1-x}N$ layer, where $0 \le x \le 1$, or an $Al_xGa_{1-x}N$ layer, where $0.15 \le x \le 0.6$. The channel-supplying layer 140 may have a thickness of about 20 nm to about 50 nm.

A 2DEG region may be formed in a part of the channel layer 130 near an interface between the channel layer 130 and the channel-supplying layer 140. When there is a heterostructure in which the channel layer 130 and the channel-supplying layer 140 are gallium nitride and aluminum gallium nitride, respectively, the 2DEG region may be formed at III-V nitride layers (that is, at a gallium nitride layer and at an aluminum gallium nitride layer) by spontaneous polarization and piezo polarization due to tensile strain. The 2DEG region may work as a current passage between the source electrode 182 and the drain electrode 184 (i.e., as a channel region).

The etch-stop layer 150 may be formed on the channel-supplying layer 140 and may cover an entire top surface of the channel-supplying layer 140.

If the etch-stop layer 150 is not formed on the channel-supplying layer 140, the p-type semiconductor layer pattern 160 is formed directly on the channel-supplying layer 140. In this case, an upper surface of the channel-supplying layer 140 may be damaged in the process of forming the p-type semiconductor layer pattern 160. For example, if an etching process is performed in the process of forming the p-type semiconductor layer pattern 160, the upper surface of the channel-supplying layer 140 may be directly exposed to etchant and thus the upper surface of the channel-supplying layer 140 may be damaged. Thus, a surface trap density (at which electrons are trapped on the upper surface of the channel-supplying layer 140 in an on-state) may increase. As a result, a current collapse may occur where an on-resistance sharply increases as a voltage applied to the drain electrode 184 increases. However, since the etch-stop layer 150 is formed on the channel-supplying layer 140, the present embodiment may prevent damage to the upper surface of the channel-supplying layer 140 in the process of forming the p-type semiconductor layer pattern 160. Thus, the current collapse may be minimized.

In addition, the etch-stop layer 150 may form a stable interface with respect to the upper surface of the channel-supplying layer 140. The etch-stop layer 150 may function as a passivation layer that protects the surface of the channel-supplying layer 140; and, thus, the leakage of currents due to the surface trap of the channel-supplying layer 140 may be avoided, thereby decreasing an on-resistance of the HEMT device 100.

The etch-stop layer 150 may include a material having an etch selectivity with respect to the p-type semiconductor layer pattern 160. In exemplary embodiments, the etch-stop layer 150 may include silicon carbon nitride ($Si_xC_{1-x}N$, $0 \leq x \leq 1$). In the process of etching to form the p-type semiconductor layer pattern 160, it may be difficult to accurately control an etch thickness of the p-type semiconductor layer pattern 160 since both the p-type semiconductor layer pattern 160 and the channel-supplying layer 140 include nitride materials. The present inventive concepts include the etch-stop layer 150 between the p-type semiconductor layer pattern 160 and the channel-supplying layer 140; and, thus, the channel-supplying layer 140 under the etch-stop layer 150 may be rarely affected even if the p-type semiconductor layer pattern 160 is sufficiently etched. Thus, it may be easy to control etch thickness of the p-type semiconductor layer pattern 160; and fluctuations in on-resistance and fluctuations in threshold voltage of the HEMT device due to the inaccurate etch thickness of the p-type semiconductor layer pattern 160 may be avoided.

In exemplary embodiments, the etch-stop layer 150 may have a thickness of about 1 nm to 100 nm. When the thickness of the etch-stop layer 150 is less than 1 nm, the channel-supplying layer 140 may not be sufficiently protected in the etching process of the p-type semiconductor layer pattern 160. When the thickness of the etch-stop layer 150 is larger than 100 nm, the performance of the HEMT device 100 may be affected by the etch-stop layer 150.

The p-type semiconductor layer pattern 160 may be formed on a part of the etch-stop layer 150. Since the p-type semiconductor layer pattern 160 is formed to have a width that is less than that of the etch-stop layer 150, the p-type semiconductor layer pattern 160 may be formed so that its entire bottom is in contact with the etch-stop layer 150.

The p-type semiconductor layer pattern 160 may be formed between the gate electrode 186 and the channel-supplying layer 140 to implement a normally off characteristic. The normally off characteristic indicates a characteristic that is in an off state when a voltage is not applied to the gate electrode 186 (i.e., in a normal mode), and that is in an on state when a voltage is applied to the gate electrode 186. The p-type semiconductor layer pattern 160 may form a depletion region in the 2DEG region formed in the channel layer 130 so that a discontinuous 2DEG region section may be formed in the channel layer 130 between the source electrode 182 and the drain electrode 184. For example, the 2DEG region may not be formed in a portion of the channel layer 130 under the p-type semiconductor layer pattern 160.

Figure 2:
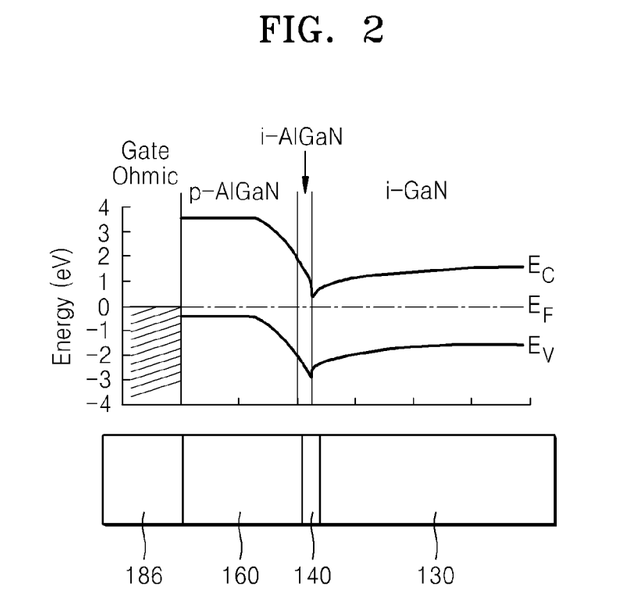
FIG. 2 is a schematic band diagram of an HEMT device employing a p-type semiconductor layer pattern.

For example, FIG. 2 shows a schematic band diagram that is exhibited by a structure in which the gate electrode 186, the p-type semiconductor layer pattern 160, the channel-supplying layer 140, and the channel layer 130 are stacked. FIG. 2 illustratively represents a band diagram when the p-type semiconductor layer pattern 160 is a p-doped AlGaN layer, the channel-supplying layer 140 is an undoped AlGaN layer (an intrinsic AlGaN layer), and the channel layer 130 is an undoped GaN layer (an intrinsic GaN layer). The level of an energy band around the channel-supplying layer 140 may rise by p-n junction, which is made when the p-type semiconductor layer pattern 160 is formed between the channel-supplying layer 140 and the gate electrode 186. While a bias is not applied to the gate electrode 186, a depletion region may be formed at the channel layer 130 under the gate electrode 186, and a 2DEG region may thus be depleted because a conduction band ($E_C$) is formed more highly than the Fermi level ($E_F$) at the regions between the channel layer 130 and the gate electrode 186. Thus, the 2DEG region may not be formed at the channel layer 130 under the p-type semiconductor layer pattern 160; and a normally off structure in which current does not flow in the absence of a bias applied to the gate electrode 186 may be realized.

In exemplary embodiments, the p-type semiconductor layer pattern 160 may have a thickness of about 10 nm to about 200 nm. When the thickness of the p-type semiconductor layer pattern 160 is less than 10 nm, the normally on characteristic, wherein a current flows in an off state, may be expressed because the depletion region is not sufficiently formed in the 2DEG region of the channel layer 130. When the thickness of the p-type semiconductor layer pattern 160 is larger than 200 nm, the band gap energy of the channel-supplying layer 140 under the p-type semiconductor layer pattern 160 may excessively rise by the p-type semiconductor layer pattern 160; and, thus, the bias voltage needed to be applied to the gate electrode 186 to establish an on state may be excessively increased.

In exemplary embodiments, the p-type semiconductor layer pattern 160 may include gallium nitride, aluminum gallium nitride, etc., and may include dopants, such as Mg, Zn, Be, etc., at a doping concentration of about $1 \times 10^{17}/cm^3$ to $1 \times 10^{22}/cm^3$.

A first passivation layer 174 may be formed on the etch-stop layer 150 in a shape that surrounds the sidewalls of the p-type semiconductor layer pattern 160, and a second passivation layer 176 may be formed on the first passivation layer 174. The first passivation layer 174 and the second passivation layer 176 may include silicon oxide, silicon nitride, silicon oxynitride, etc. The first passivation layer 174 and the second passivation layer 176 may include the same material or different materials.

The source electrode 182 and the drain electrode 184 may be formed so that they both pass through the first and second passivation layers 174 and 176, through the etch-stop layer 150, and through the channel-supplying layer 140. The source electrode 182 and the drain electrode 184 may be connected to the channel layer 130. The channel layer 130 is between the source electrode 182 and the drain electrode 184 and has a 2DEG region therein and may function as a channel region of the HEMT device 100.

The gate electrode 186 may be formed on the p-type semiconductor layer pattern 160 between the source electrode 182 and the drain electrode 184. A bottom surface of the gate electrode 186 may be in contact with a top surface of the p-type semiconductor layer pattern 160. Although FIG. 1 shows that the gate electrode 186 is formed to have a shape with substantially the same width as that of the p-type semiconductor layer pattern 160, the width of the gate electrode 186 may be formed to be less than that of the p-type semiconductor layer pattern 160.

According to the present inventive concepts, since the etch-stop layer 150 is interposed between the channel-supplying layer 140 and the p-type semiconductor layer pattern 160, damages to the surface of the channel-supplying layer 140 may be avoided in the etching process of the p-type semiconductor layer pattern 160, thereby decreasing the leakage of currents. In addition, accurate control of the thickness of the p-type semiconductor layer pattern 160 may be easily established; and, thus, the HEMT device 100 may have a stable normally off characteristic.

Figure 3:
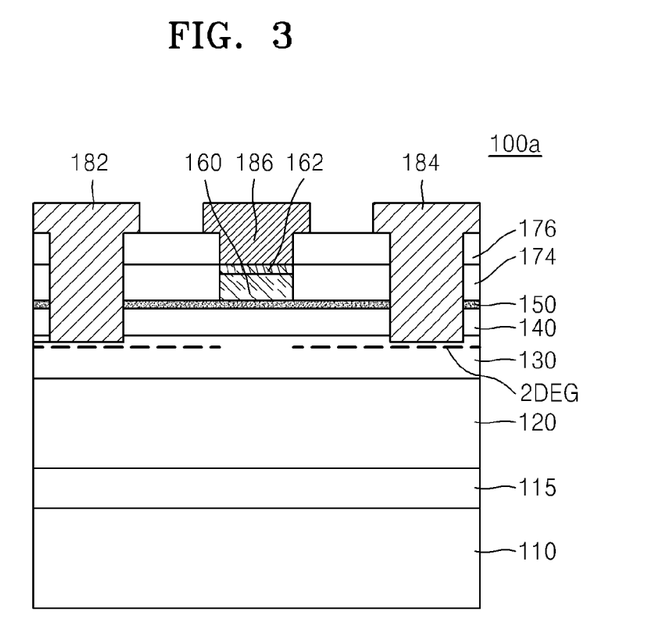
FIG. 3 is a cross-sectional view of an HEMT device according to an exemplary embodiment.

FIG. 3 is a cross-sectional view of an HEMT device 100a according to an exemplary embodiment. The HEMT device 100a is similar to the HEMT device 100 that has been described with reference to FIG. 1, except that it further includes an n-type semiconductor layer 162.

Referring to FIG. 3, the HEMT device 100a may further include the n-type semiconductor layer 162 between the p-type semiconductor layer pattern 160 and the gate electrode 186. The n-type semiconductor layer 162 may completely cover a top surface of the p-type semiconductor layer pattern 160. The n-type semiconductor layer 162 may prevent current from leaking from the gate electrode 186 to the p-type semiconductor layer pattern 160. The n-type semiconductor layer 162 may include aluminum nitride, gallium nitride, aluminum gallium nitride, indium nitride, aluminum indium nitride, indium gallium nitride, aluminum indium gallium nitride, etc., and an n-type dopant, such as silicon (Si), germanium (Ge), tin (Sn), etc., may be doped in the n-type semiconductor layer 162 at a given concentration.

Figure 4:
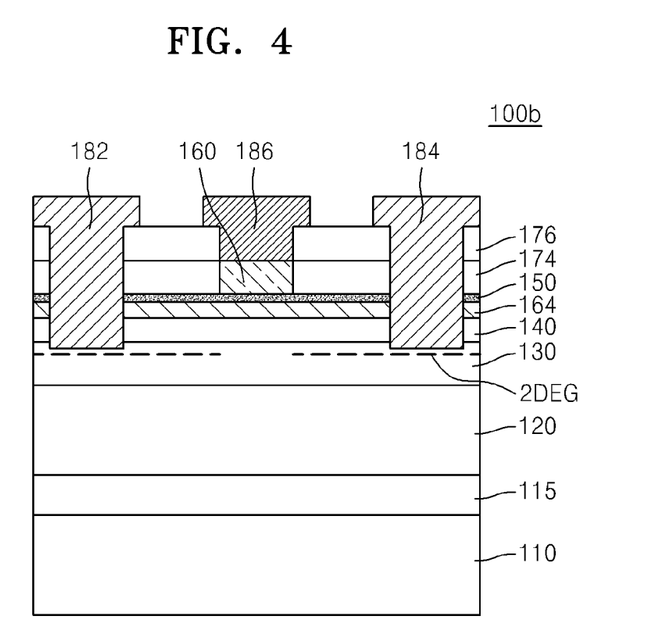
FIG. 4 is a cross-sectional view of an HEMT device according to an exemplary embodiment.

FIG. 4 is a cross-sectional view of an HEMT device 100b according to an exemplary embodiment. The HEMT device 100b is similar to the HEMT device 100 that has been described with reference to FIG. 1, except that it further includes a hole injection layer 164.

Referring to FIG. 4, the HEMT device 100b may further include the hole injection layer 164 between the channel-supplying layer 140 and the etch-stop layer 150. The hole injection layer 164 may include a material with a band gap energy different from that of the channel-supplying layer 140. The hole injection layer 164 may prevent currents from leaking from the gate electrode 186 to the channel-supplying layer 140 because it forms an energy barrier with respect to the channel-supplying layer 140. For example, the hole injection layer 164 may include a GaN material doped with a p-type dopant, but the material of the hole injection layer 164 is not limited thereto; and the hole injection layer 164 may include a p-type semiconductor material having a band gap energy different from that of the channel-supplying layer 140.

The hole injection layer 164 may completely cover the top of the channel-supplying layer 140. For example, the hole injection layer 164 may have a thickness of 20 nm or less. When the thickness of the hole injection layer 164 is too large, the conduction band level of the channel layer 130 may rise so that an electron density near an interface between the channel layer 130, in which a 2DEG region may be formed; and the channel-supplying layer 140 may be decreased, thereby increasing the on-resistance between the source electrode 182 and the drain electrode 184. Thus, the thickness of the hole injection layer 164 may be less than or equal to a critical thickness that does not influence the 2DEG in the channel layer 130 under the hole injection layer 164; and the 2DEG region may be formed in portions of the channel layer 130 between the source electrode 182 and the drain electrode 184.

Figure 5:
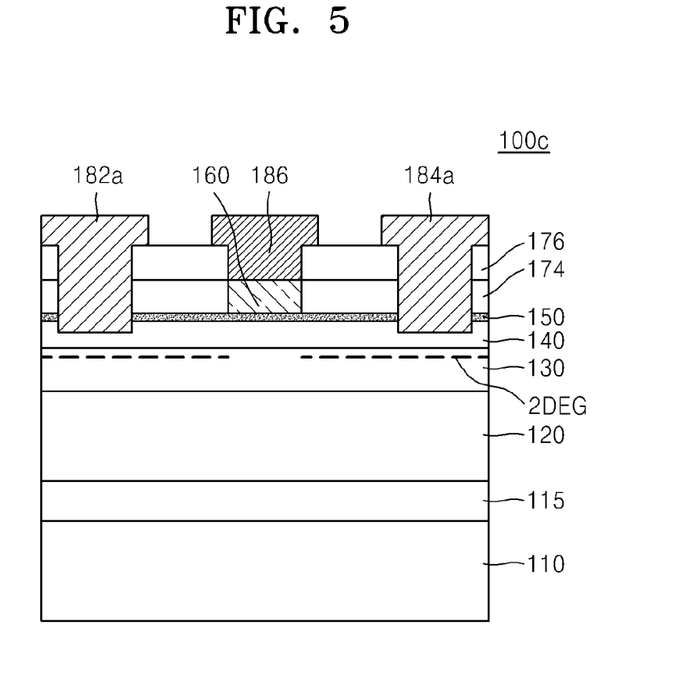
FIG. 5 is a cross-sectional view of an HEMT device according to an exemplary embodiment.

FIG. 5 is a cross-sectional view of an HEMT device 100c according to an exemplary embodiment. The HEMT device 100c is similar to the HEMT device 100 that has been described with reference to FIG. 1, except for the shapes of a source electrode 182a and a drain electrode 184a.

Referring to FIG. 5, the source electrode 182a and the drain electrode 184a may be formed so that they both pass through the first passivation layer 174, the second passivation layer 176, and the etch-stop layer 150 and are connected to the channel-supplying layer 140.

In this case, the channel-supplying layer 140 may be etched by a given thickness from the top, and the source electrode 182a and the drain electrode 184a may be placed on the etched region. Alternatively, unlike FIG. 5, the upper portion of the channel-supplying layer 140 may not be etched and the source electrode 182a and the drain electrode 184a may be formed on the non-etched top of the channel-supplying layer 140.

Figure 6:
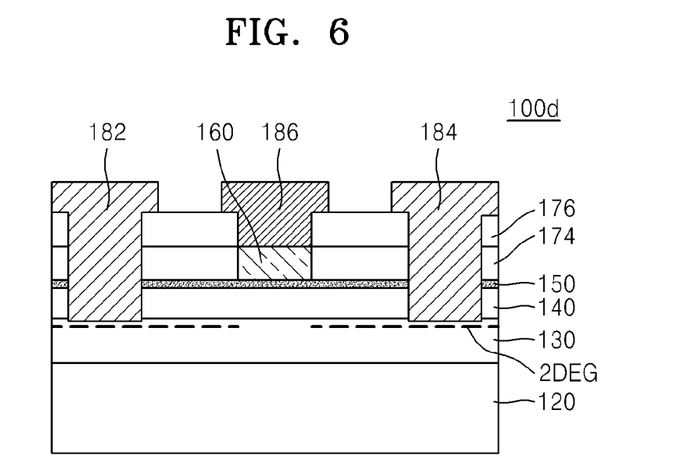
FIG. 6 is a cross-sectional view of an HEMT device according to an exemplary embodiment.

FIG. 6 is a cross-sectional view of an HEMT device 100d according to an exemplary embodiment. The HEMT device 100d is similar to the HEMT device 100 that has been described with reference to FIG. 1, except that it may not include a substrate and a buffer layer.

Referring to FIG. 6, the HEMT device 100d may optionally include a substrate 110 and a buffer layer 115. For example, it is possible to fabricate the HEMT device 100d and then remove the substrate 110 or both the substrate 110 and the buffer layer 115. Thus, the HEMT device 100d may not include the substrate 110 and/or the buffer layer 115.

FIG. 7A to 7F are cross-sectional views of a method of fabricating an HEMT device, according to an exemplary embodiment. The fabricating method may be a method of fabricating the HEMT device 100 that is described with reference to FIG. 1.

Figure 7A:
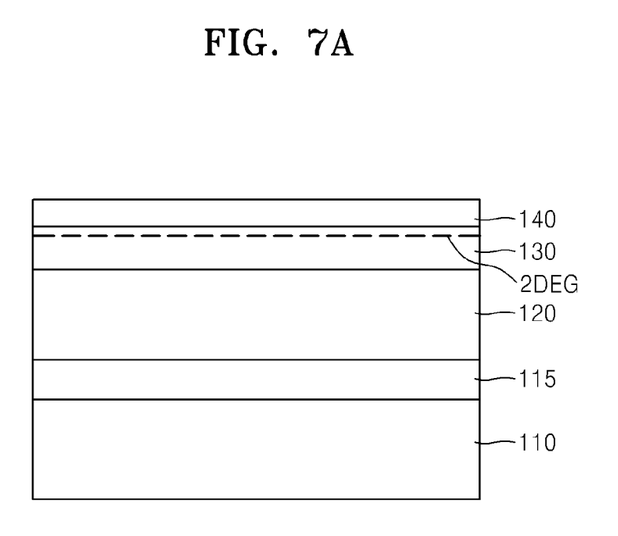
FIG. 7A to 7F are cross-sectional views related to a method of fabricating an HEMT device, according to an exemplary embodiment.

Referring to FIG. 7A, the buffer layer 115 may be formed on the substrate 110. In exemplary embodiments, the buffer layer 115 may include gallium nitride. For example, the buffer layer 115 may be formed on the substrate 110 by a molecular beam epitaxy (MBE) process, a hydride vapor phase epitaxy (HVPE) process, or a metal-organic vapor phase epitaxy (MOVPE) process. The buffer layer 115 may include, e.g., aluminum nitride, aluminum gallium nitride, silicon carbon nitride, etc., but the material of the buffer layer 115 is not limited thereto.

The high-resistance semiconductor layer 120 may be formed on the buffer layer 115. The high-resistance semiconductor layer 120 may include gallium nitride. The high-resistance semiconductor layer 120 may be formed by an in-situ doping of dopants, such as Mg, Zn, C, Fe, etc., in a process of forming the gallium nitride layer. Alternatively, the high-resistance semiconductor layer 120 may be grown at a low temperature of about 500° C. to 600° C. Thus, the high-resistance semiconductor layer 120 may have a sheet resistance in a range of about $10^7$ $\Omega cm^{-2}$ to $10^{11}$ $\Omega cm^2$.

The channel layer 130 may be formed on the high-resistance semiconductor layer 120 and may include an undoped gallium nitride layer and be formed to have a thickness of about 10 nm to 100 nm.

Subsequently, the channel-supplying layer 140 may be formed on the channel layer 130. The channel-supplying layer 140 may include a semiconductor material having a band gap energy higher that that of the channel layer 130. As a hetero-structure including the channel layer 130 and the channel-supplying layer 140 is formed, a 2DEG region may be formed in the channel layer 130.

Figure 7B:
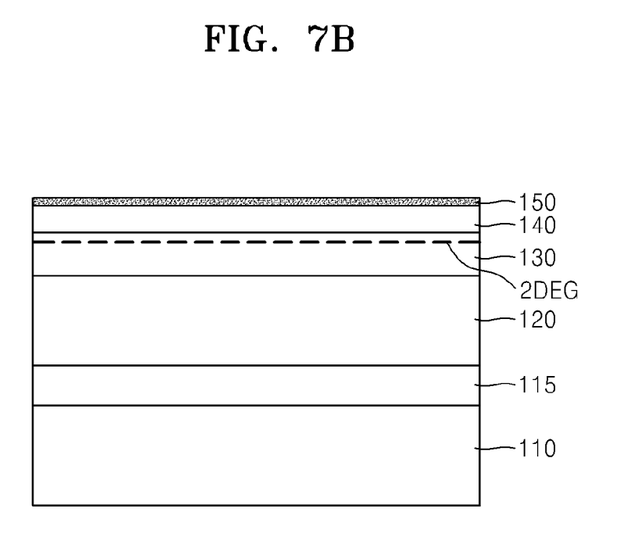

Referring to FIG. 7B, the etch-stop layer 150 may be formed on the channel-supplying layer 140. The etch-stop layer 150 may be formed to have a thickness in a range of about 1 nm to 100 nm. For example, the etch-stop layer 150 may be formed to have a thickness of about 10 nm. The etch-stop layer 150 may include silicon carbon nitride ($Si_xC_{1-x}N$, $0 \leq x \leq 1$) and be formed by an MBE process, an MOVPE process, an HYPE process, etc. The etch-stop layer 150 may be formed in situ in the process of forming the channel-supplying layer 140. Alternatively, the etch-stop layer 150 may be formed in a process separate from the process of forming the channel-supplying layer 140.

Figure 7C:
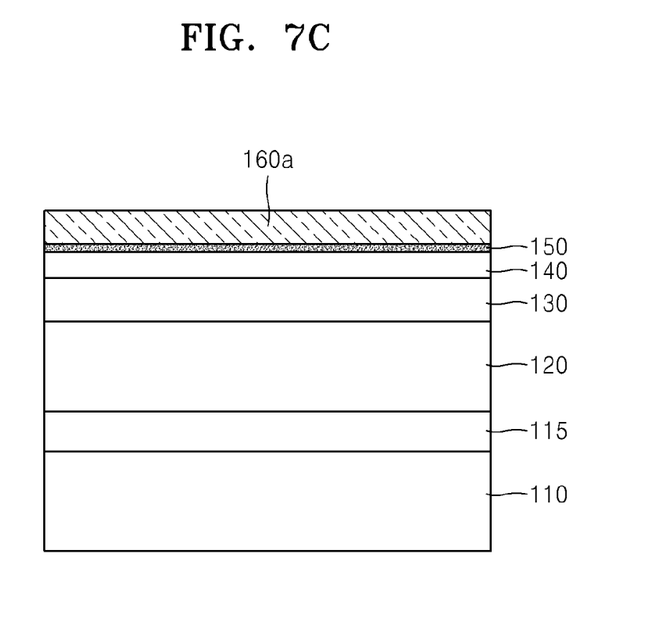

Referring to FIG. 7C, a p-type semiconductor layer 160*a* may be formed on the etch-stop layer 150. The p-type semiconductor layer 160*a* may be formed to have a thickness of about 10 nm to 100 nm. The p-type semiconductor layer 160*a* may include gallium nitride, aluminum gallium nitride, etc., and may include a dopant, such as Mg, Zn, Be, etc., at a doping concentration of about $1 \times 10^{17}/cm^3$ to $1 \times 10^{22}/cm^3$.

As the p-type semiconductor layer 160*a* is formed on the hetero-structure of the channel-supplying layer 140 and the channel layer 130, the conduction band level of the channel layer 130 may be raised so that a 2DEG region may not be formed in the channel layer 130.

Figure 7D:
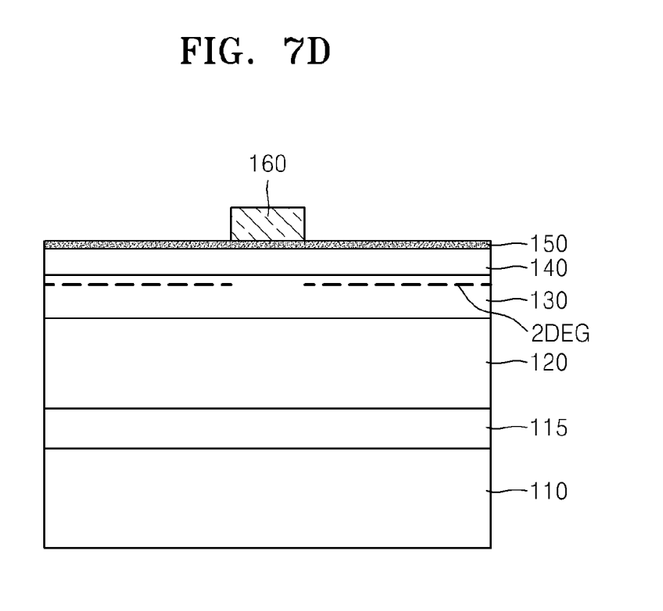

Referring to FIG. 7D, the p-type semiconductor layer 160*a* may be patterned to form the p-type semiconductor layer pattern 160. For example, a photoresist layer (not shown) may be formed on a portion of the p-type semiconductor layer 160*a*; and only a portion of the p-type semiconductor layer 160*a* on which the photoresist layer is not disposed may be exposed. The exposed portion of the p-type semiconductor layer 160*a* may be removed using the photoresist layer as a mask until an upper surface of the etch-stop layer 150 is exposed.

In exemplary embodiments, the patterning process may be a dry etching process. For example, a dry etching process—in which a gas including chlorine ($Cl_2$) and/or boron trichloride ($BCl_3$) is used as etchant—may be performed, but the kind of the etching process is not limited thereto.

The etch-stop layer 150 may include a material having etch selectivity with respect to the p-type semiconductor layer 160*a*. For example, when using an etchant to pattern the p-type semiconductor layer 160*a*, the etching rate of the etch-stop layer 150 may be lower than that of the p-type semiconductor layer 160*a*. Thus, until the p-type semiconductor layer 160*a* is sufficiently etched, the etching process may be performed; and control of the thickness of the p-type semiconductor layer pattern 160 may be easily and accurately controlled.

In the etching process for forming the p-type semiconductor layer pattern 160, damage to the upper surface of the channel-supplying layer 140 may be prevented as the top of the channel-supplying layer 140 is completely covered by the etch-stop layer 150.

As the p-type semiconductor layer pattern 160 is formed on a part of the channel layer 130, a 2DEG region may not be formed on some parts of the channel layer 130 on which the p-type semiconductor layer pattern 160 is formed; and the 2DEG region may be formed on the other parts of the channel layer 130 on which the p-type semiconductor layer pattern 160 is not formed.

Figure 7E:
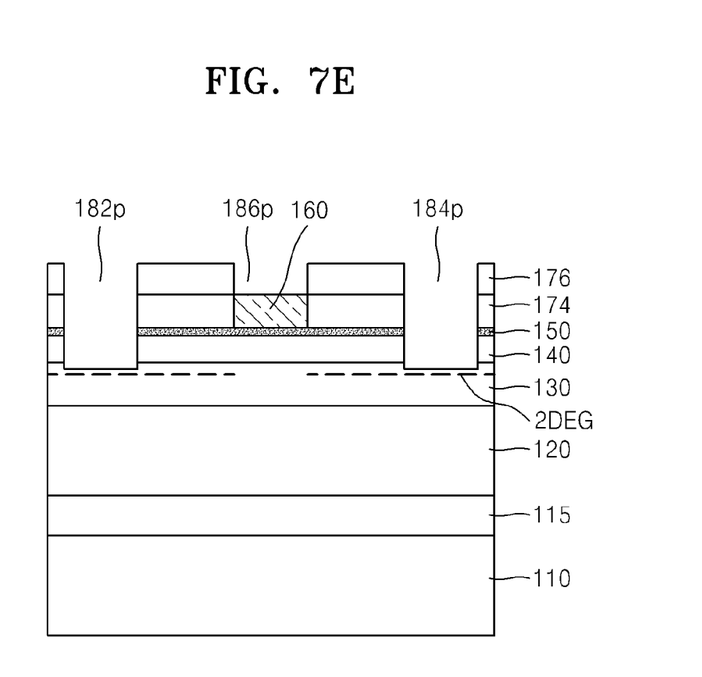

Referring to FIG. 7E, the first passivation layer 174 may be formed on the etch-stop layer 150 to cover the p-type semiconductor layer pattern 160; and the second passivation layer 176 may be formed on the first passivation layer 174.

In exemplary embodiments, after the first passivation layer 174 is formed, the first passivation layer 174 is planarized until the top of the p-type semiconductor layer pattern 160 is exposed. Subsequently, the second passivation layer 176 may be formed on the first passivation layer 174 and on the p-type semiconductor layer pattern 160.

Subsequently, a source electrode hole 182*p* and a drain electrode hole 184*p* may be formed in the first and second passivation layers 174 and 176, in the etch-stop layer 150, and in the channel-supplying layer 140 and may expose the top of the channel layer 130. A gate electrode hole 186*p* may be formed in the first and second passivation layers 174 and 176 to expose the top of the p-type semiconductor layer pattern 160. For example, the processes of forming the source electrode hole 182*p*, the drain electrode hole 184*p*, and the gate electrode hole 186*p* may be a high-frequency inductively coupled plasma reactive ion etching (ICP-RIE) process.

Figure 7F:
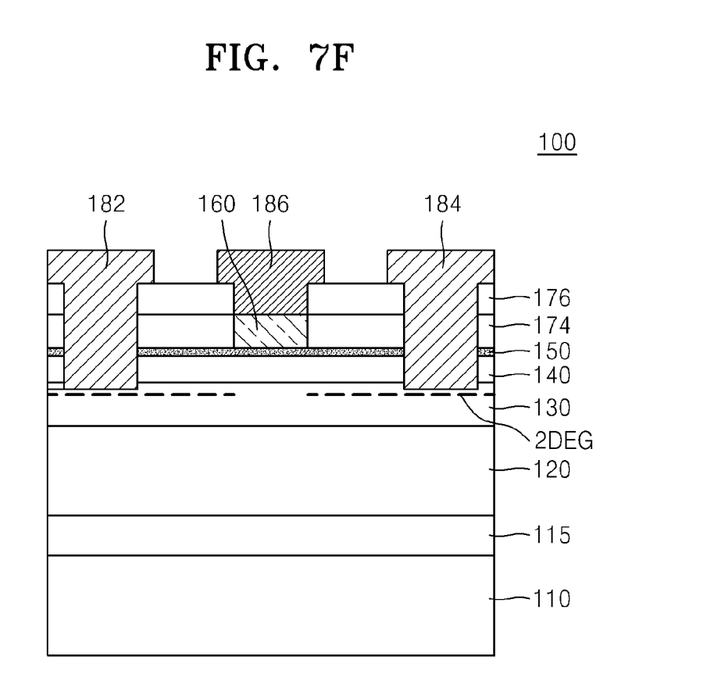

Referring to FIG. 7F, the source electrode hole 182*p* and the drain electrode hole 184*p* may be filled with a conductive material to form the source electrode 182 and the drain electrode 184 that are connected to the channel layer 130.

The conductive material may include at least one of tantalum (Ta), tantalum nitride (TaN), tungsten (W), aluminum (Al), titanium (Ti), and titanium nitride (TiN). For example, the source electrode 182 and the drain electrode 184 may have a structure in which metal layers including Ta, Al, W, and TiN are stacked. However, the materials of the source and drain electrodes 182 and 184 are not limited thereto; and the source and drain electrodes 182 and 184 may include any material that may be in ohmic contact with the channel layer 130.

Subsequently, heat treatment may be performed at a temperature of about 500° C. to 600° C.

The gate electrode hole 186*p* may be filled with a conductive material to form the gate electrode 186 that is connected to the p-type semiconductor layer pattern 160.

The HEMT device 100 is completely manufactured to perform the above-described processes.

According to the method of fabricating the HEMT device 100, the etch-stop layer 150 may protect the top of the channel-supplying layer 140 in the process of forming the p-type semiconductor layer pattern 160. In addition, the etch-stop layer 150 and the channel-supplying layer 140 form a stable interface; and, thus, an on-resistance may be prevented from rising due to a surface charge trap and current collapse may be minimized.

Figure 8:
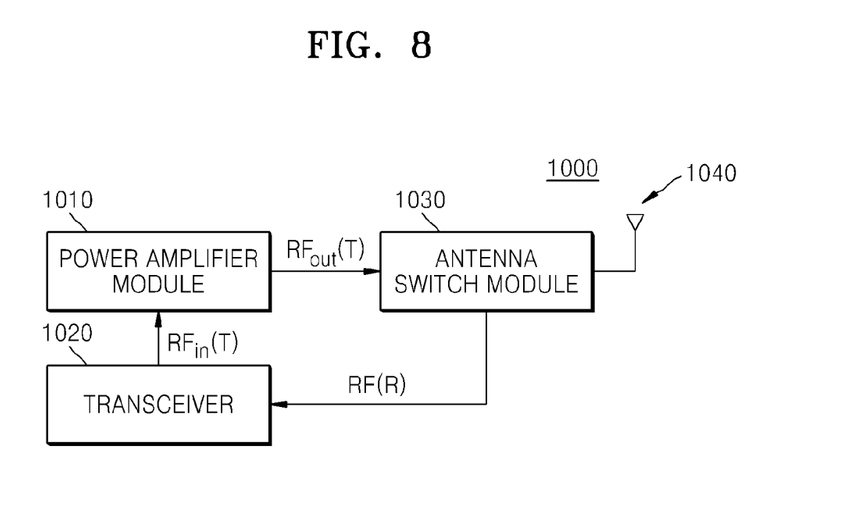
FIG. 8 is a schematic diagram of a power module system employing an HEMT, according to an exemplary embodiment.

FIG. 8 is a schematic diagram of a power module system 1000 employing an HEMT, according to an exemplary embodiment.

Referring to FIG. 8, the power module system 1000 may include a power amplifier module 1010 that includes HEMT devices 100 and 100*a* to 100*d* according to exemplary embodiments of the present inventive concepts. In addition, the power amplifier module 1010 may be a radio frequency (RF) power amplifier module. The power module system 1000 may include a transceiver 1020 that is coupled to the RF power amplifier module 1010.

The RF power amplifier module 1010 may receive an RF input signal, $RF_{in}(T)$, from the transceiver 1020 and may amplify the RF input signal, $RF_{in}(T)$, to provide an RF output signal, $RF_{out}(T)$, The RF input signal, $RF_{in}(T)$, and RF output signal, $RF_{out}(T)$, may correspond to the transmitting mode of signals indicated by arrows in FIG. 8.

The amplified RF output signal, $RF_{out}(T)$, may be provided to an antenna switch module (ASM) 1030 and may facilitate the over-the-air (OTA) transmission of the RF output signal, $RF_{out}(T)$, through an antenna structure 1040. The antenna switch module 1030 may also receive RF signals, RF(R), through the antenna structure and may couple the received RF signals, RF(R), to a transceiver, and these may correspond to the receiving mode of signals.

In exemplary embodiments, the antenna structure 1040 may include unidirectional or multi-directional and/or omni-directional antennas. For example, the antenna structure 1040 may be a dipole, monopole, patch, loop, or microstrip antenna. In addition, the antenna structure 1040 is not limited thereto but may include all kinds of antennas that are suitable for the OTA transmission or for reception of RF signals.

The system may be a system including power amplification. For example, the power module system 1000 may be used for power amplification at a high frequency and for various purposes, such as a personal communication service, satellite communication, a radar system, broadcasting communication, and medical equipment.

One of ordinary skill in the art would recognize that the present inventive concepts are not limited to the above-described embodiments and to the accompanying drawings; and replacements, variations, and changes may be made thereto without departing from the technical spirit of the present inventive concepts.

What is claimed is:

1. A high-electron-mobility transistor device, comprising:
a substrate;
a plurality of semiconductor layers formed on the substrate, wherein the plurality of semiconductor layers comprises a first semiconductor layer and a second semiconductor layer that are sequentially formed on the substrate, and wherein a two-dimensional electron gas (2DEG) region is formed in apart of the first semiconductor layer adjacent to an interface between the first semiconductor layer and the second semiconductor layer;
an etch-stop layer formed on the plurality of semiconductor layers,
a p-type semiconductor layer pattern formed on the etch-stop layer;
a gate electrode formed on the p-type semiconductor layer pattern; and
a hole injection layer between the etch-stop layer and the second semiconductor layer.

2. The high-electron-mobility transistor device of claim 1, wherein the 2DEG region is not formed in a part of the first semiconductor layer that overlaps with the p-type semiconductor layer pattern.

3. The high-electron-mobility transistor device of claim 1, wherein the second semiconductor layer comprises a material having a band gap energy higher than that of the first semiconductor layer.

4. The high-electron-mobility transistor device of claim 1, wherein the first semiconductor layer comprises gallium nitride, and wherein the second semiconductor layer comprises aluminum gallium nitride.

5. The high-electron-mobility transistor device of claim 1, wherein the p-type semiconductor layer pattern comprises gallium nitride doped with p-type impurities or aluminum gallium nitride doped with p-type impurities.

6. The high-electron-mobility transistor device or claim 1, wherein the etch-stop layer is in contact with an entire bottom surface of the p-type semiconductor layer pattern.

7. The high-electron-mobility transistor device of claim 1, wherein the etch-stop layer comprises silicon carbon nitride ($Si_xC_{1-x}N$), where $0<x<1$.

8. The high-electron-mobility transistor device of claim 1, further comprising an n-type semiconductor layer between the p-type semiconductor layer pattern and the gate electrode.

9. A high-electron-mobility transistor device comprising:
a substrate;
a channel layer formed on the substrate;
a channel-supplying layer formed on the channel layer;
an etch-stop layer formed on the channel-supplying layer;
a p-type semiconductor layer pattern formed on a part of the etch-stop layer;
a gate electrode on the p-type semiconductor layer pattern; and
a source electrode and a drain electrode that pass through the etch-stop layer and the channel-supplying layer and that are connected to the channel layer.

10. The high-electron-mobility transistor device of claim 9, wherein the etch-stop layer is formed on an entire top surface of the channel-supplying layer.

11. The high-electron-mobility transistor device of claim 9, wherein the gate electrode is formed to vertically overlap with the p-type semiconductor layer pattern.

12. The high-electron-mobility transistor device of claim 9, wherein the p-type semiconductor layer pattern has a shape that has a width that is substantially the same as that of the gate electrode.

* * * * *